United States Patent
Pozder et al.

(10) Patent No.: US 7,378,339 B2
(45) Date of Patent: May 27, 2008

(54) BARRIER FOR USE IN 3-D INTEGRATION OF CIRCUITS

(75) Inventors: Scott K. Pozder, Austin, TX (US); Lynne M. Michaelson, Providence, RI (US); Varughese Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 142 days.

(21) Appl. No.: 11/278,042

(22) Filed: Mar. 30, 2006

(65) Prior Publication Data

US 2007/0231950 A1    Oct. 4, 2007

(51) Int. Cl.
*H01L 21/4763*    (2006.01)
*H01L 21/44*    (2006.01)

(52) U.S. Cl. ............... 438/620; 438/599; 438/618; 438/639; 438/656; 257/E21.584

(58) Field of Classification Search ............ 438/636, 438/641, 656, 599, 618, 620
See application file for complete search history.

(56) References Cited

U.S. PATENT DOCUMENTS

| 5,640,049 A | * | 6/1997 | Rostoker et al. | ............ 257/758 |
| 5,756,395 A | * | 5/1998 | Rostoker et al. | ............ 438/622 |
| 6,656,748 B2 | * | 12/2003 | Hall et al. | ............ 438/3 |
| 6,764,950 B2 | * | 7/2004 | Noguchi et al. | ............ 438/687 |
| 7,176,128 B2 | * | 2/2007 | Ahrens et al. | ............ 438/643 |
| 2005/0054122 A1 | * | 3/2005 | Celii et al. | ............ 438/3 |

OTHER PUBLICATIONS

Craig Keast, et al., MIT Lincoln Laboratory's 3D Circuit Integration Technology, Apr. 13, 2004, SEMATECH 3D Technology, Modeling and Process Symposium.

* cited by examiner

*Primary Examiner*—Michael Lebentritt
*Assistant Examiner*—Seahvosh Nikmanesh
(74) *Attorney, Agent, or Firm*—Ranjeev Singh; Joanna G. Chiu

(57) ABSTRACT

A method for forming a semiconductor device includes providing a first integrated circuit having a landing pad and attaching a second integrated circuit to the first integrated circuit using at least one bonding layer. The second integrated circuit has an inter-circuit trace, the inter-circuit trace has an inter-circuit trace opening. The method further includes forming an opening through the second integrated circuit, the opening extending through the inter-circuit trace opening, forming a selective barrier on exposed portions of the inter-circuit trace in the opening, extending the opening through the at least one bonding layer to the landing pad, and filling the opening with a conductive fill material. The selective barrier layer comprises at least one of cobalt or nickel, and the conductive fill material electrically connects the inter-circuit trace and the landing pad.

17 Claims, 5 Drawing Sheets

BARRIER FOR USE IN 3-D INTEGRATION OF CIRCUITS

BACKGROUND OF THE INVENTION

1. Field of the Invention

This invention relates in general to 3-D integration of circuits and more specifically to a barrier for use in 3-D integration of circuits.

2. Description of the Related Art

Traditionally, 3-D integration of circuits is achieved using face-to-face bonding of wafers, such as acceptor wafers and donor wafers, or dies. Acceptor wafer is typically the bottom wafer and donor wafer is typically the top wafer. Interconnects in the bonded wafers or dies are connected using various techniques, such as stitch vias. Formation of stitch vias, which are typically formed on the backside of a donor wafer, is, however, time consuming and requires additional steps for achieving 3-D integration of wafers or dies. In particular, for example, formation of stitch vias requires two inter-wafer vias having differing lengths that are linked on the backside of the donor wafer.

Additionally, etching of inter-wafer vias can cause several problems for etch processing. For example, etching of such inter-wafer vias in low-K dielectric wafers requires etching through multiple types of dielectric materials, such as silicon nitride, silicon carbon-nitride, silicon-oxide, and SiCOH containing low-K dielectrics. This in turn requires a wide range of etch processes, such as both physical and chemical etch processes. Certain physical and chemical etch processes can redistribute the copper into the dielectric layers. This problem, for example, especially occurs when inter-wafer connects are used as embedded etch masks.

Thus, there is a need for improved 3-D integration of circuits.

BRIEF DESCRIPTION OF THE DRAWINGS

The present invention may be better understood, and its numerous objects, features, and advantages made apparent to those skilled in the art by referencing the accompanying drawings.

Figure 1:
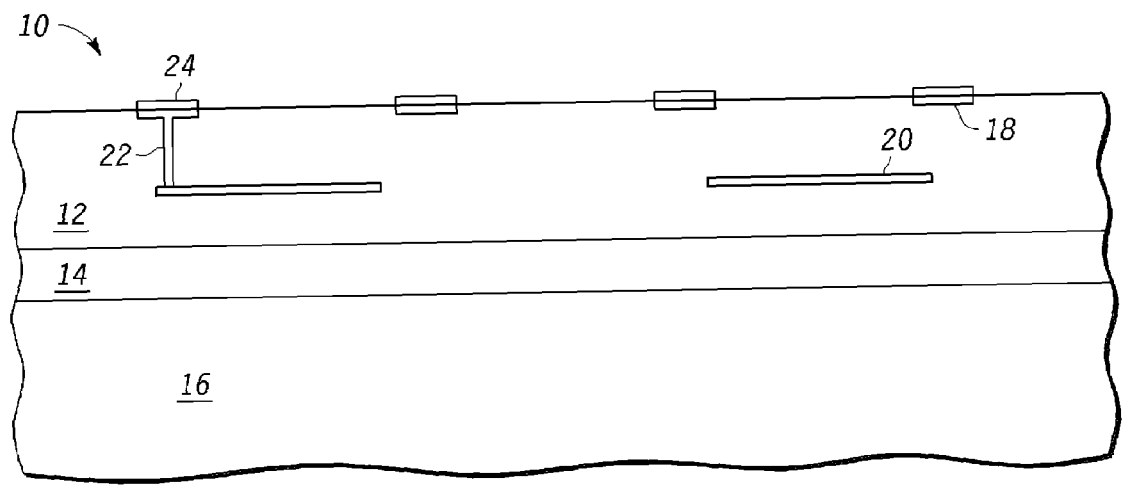
FIG. 1 is a partial side view of one embodiment of an exemplary acceptor wafer during a processing stage, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, a method for forming a semiconductor device is provided. The method includes providing a first integrated circuit having a landing pad and attaching a second integrated circuit to the first integrated circuit using at least one bonding layer. The second integrated circuit has an inter-circuit trace, the inter-circuit trace has an inter-circuit trace opening. The method further includes forming an opening through the second integrated circuit, the opening extending through the inter-circuit trace opening, forming a selective barrier on exposed portions of the inter-circuit trace in the opening, extending the opening through the at least one bonding layer to the landing pad, and filling the opening with a conductive fill material. The selective barrier layer comprises at least one of cobalt or nickel, and the conductive fill material electrically connects the inter-circuit trace and the landing pad.

In another aspect, a method for forming a semiconductor device is provided. The method includes providing a first integrated circuit having a landing pad. The method further includes attaching a second integrated circuit to the first integrated circuit using at least one bonding layer, the second integrated circuit having an inter-circuit trace, the inter-circuit trace having an opening. The method further includes forming an opening through the second integrated circuit, the opening extending through the inter-circuit trace opening. The method further includes forming a selective barrier on exposed portions of the inter-circuit trace in the opening, the selective barrier comprising at least one material selected from a group consisting of cobalt and nickel. The method further includes extending the opening through the at least one bonding layer to the landing pad. The method further includes after extending the opening, filling the opening with a conductive fill material, wherein the conductive fill is electrically connected to the inter-circuit trace and the landing pad.

In yet another aspect, a semiconductor device including a first integrated circuit having a landing pad and at least one bonding layer over the landing pad, is provided. The semiconductor device further includes a second integrated circuit having an inter-circuit trace and at least one bonding layer over the inter-circuit trace, wherein the at least one bonding layer of the second integrated circuit is attached to the at least one bonding layer of the first integrated circuit. The semiconductor device further includes a conductive interconnect extending through the second integrated circuit, through an opening in the inter-circuit trace, through the at least one bonding layer of the second integrated circuit, and through the at least one bonding layer of the first integrated circuit to the landing pad, the conductive interconnect electrically connecting the inter-circuit trace to the landing pad. The semiconductor device further includes a barrier layer adjacent the inter-circuit trace comprising at least one material selected from a group consisting of cobalt and nickel and located in the opening of the inter-circuit trace, between the inter-circuit trace and the conductive interconnect.

Figure 2:
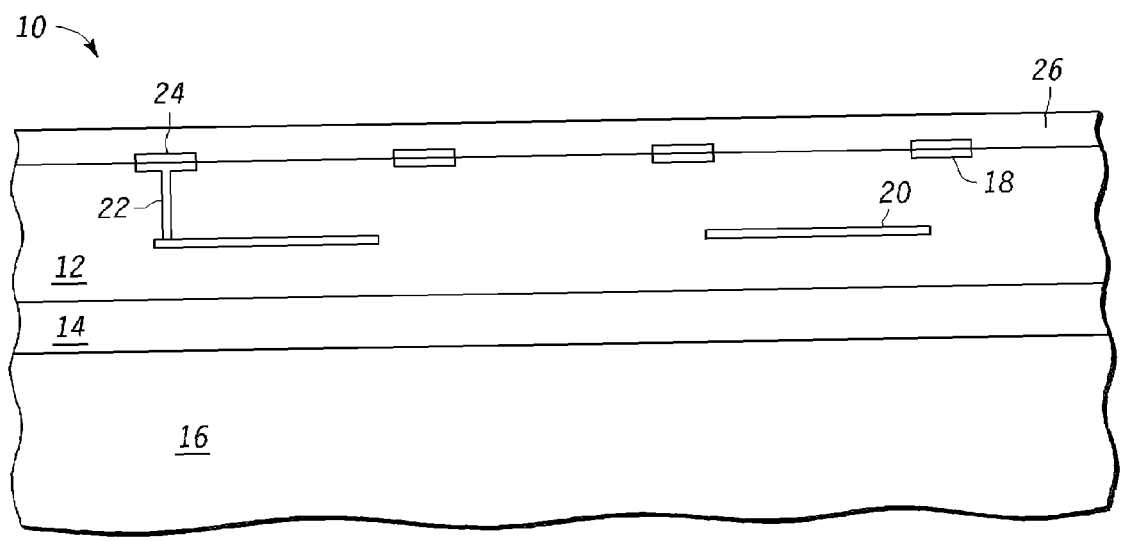
FIG. 2 is a partial side view of one embodiment of an exemplary acceptor wafer, consistent with one embodiment of the invention.

FIG. 1 is a partial side view of one embodiment of an acceptor wafer during a processing stage, consistent with one embodiment of the invention. Acceptor wafer 10 may include an interconnect layer 12, an active layer 14, and a semiconductor layer 16. Interconnect layer 12 may include interconnect 20 and via 22. A landing feature, such as a landing pad 18 may be formed as part of interconnect layer 12, as well. By way of example, a conductive barrier 24 having cobalt or nickel may be formed on top of landing pads. Although FIG. 1 shows only one of each of interconnect layer 12, active layer 14, and semiconductor layer 16, acceptor wafer 10 may include additional such layers. Further, as shown in FIG. 2, a bonding layer 26 may be formed on top of interconnect layer 12.

Figure 3:
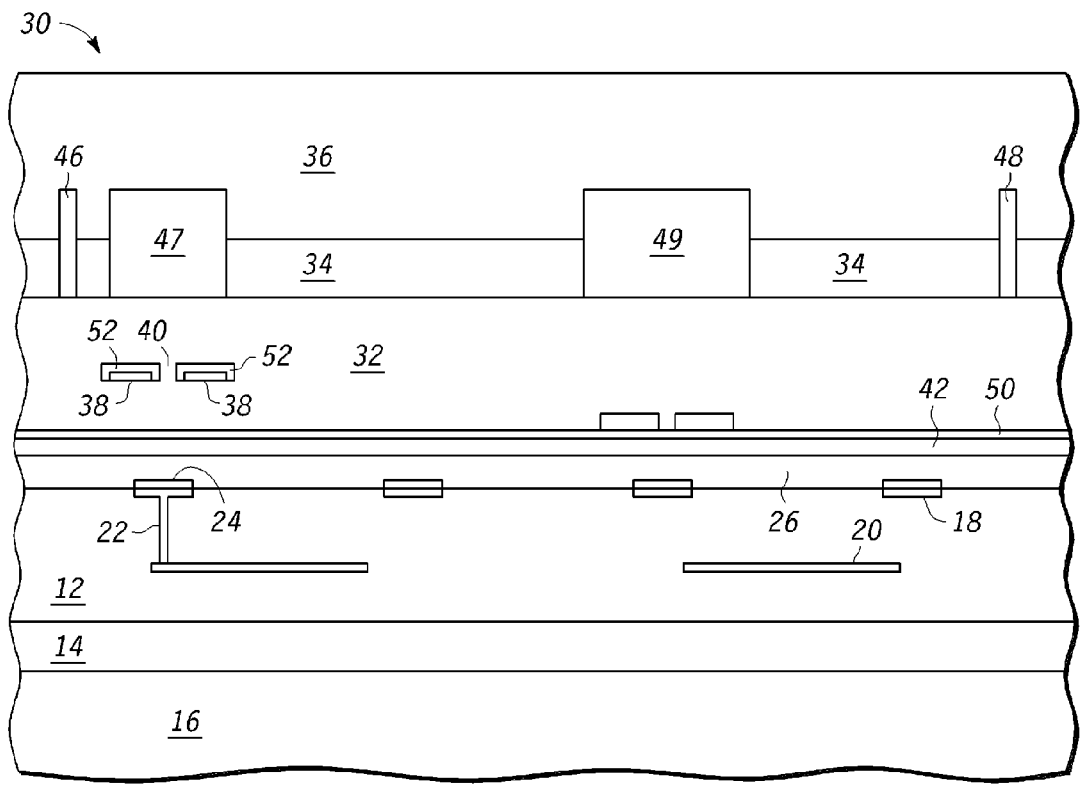
FIG. 3 is a partial side view of one embodiment of a semiconductor device during a processing stage, consistent with one embodiment of the invention.

Referring now to FIG. 3, a donor wafer 30 may be bonded face-to-face with acceptor wafer 10. Donor wafer 30 may include similar layers as acceptor wafer 10. By way of example, donor wafer 30 may include an interconnect layer 32, an active layer 34, and a semiconductor layer 36. Interconnect layer 32 may include an inter-wafer connect trace 38 with an opening 40 formed in inter-wafer connect trace 38. Inter-wafer connect trace 38 may look like a line with a hole (opening 40) in it. Inter-wafer connect trace 38 may be formed using copper or any other suitable conductive material. Although described with respect to a wafer, inter-wafer connect trace 38 may act as an inter-circuit trace in a wafer or a die. Donor wafer 30 may have an etch-stop layer 50 formed on interconnect layer 32. A bonding layer 42 may be formed over etch-stop layer 50. Although FIG. 3 shows separately formed bonding layer 42 and etch-stop layer 50, etch-stop layer may be formed as part of bonding layer 42. Alternatively, bonding layer 42 may act as an etch-stop layer. In addition, only one of acceptor wafer 10 and donor wafer 30 may have a bonding layer.

Further, as shown in FIG. 3, active layer 34 and semiconductor layer 36 may include align-keys 46 and 48, which may be used to find features in interconnect layer 32, for example. In particular, align-keys 46 and 48 may be used to align patterns on the backside of donor wafer 30, which is the top surface of the bonded wafer. Although FIG. 3 shows align-keys 46 and 48, these may not be necessary in a SOI wafer, where features may be visible through active layer 34 and semiconductor layer 36. Isolation windows 47 and 49 may be formed in active layer 34 and semiconductor layer 36 of donor wafer 30. Isolation windows 47 and 49 may be used to isolate conductive fill material formed in vias, as explained further with respect to FIGS. 8 and 9. Isolation windows 47 and 49 may contain an insulating material, such as an oxide. Although FIG. 3 shows only one of each of interconnect layer 32, active layer 34, and semiconductor layer 36, donor wafer 30 may include additional such layers. Additionally, although FIG. 3 shows face-to-face bonding of acceptor wafer 10 and donor wafer 30, they may be bonded in other configurations, as well.

Referring still to FIG. 3, a barrier layer 52 may be formed on at least top and side surfaces of inter-wafer connect trace 38. Barrier layer 52 may be formed using tantalum, titanium, tungsten or alloys thereof. Although FIG. 3 does not show barrier layer 52 formed over other interconnect traces (20, for example), barrier layer 52 may be formed over other interconnect traces in acceptor wafer 10 and donor wafer 30, as well.

Figure 4:
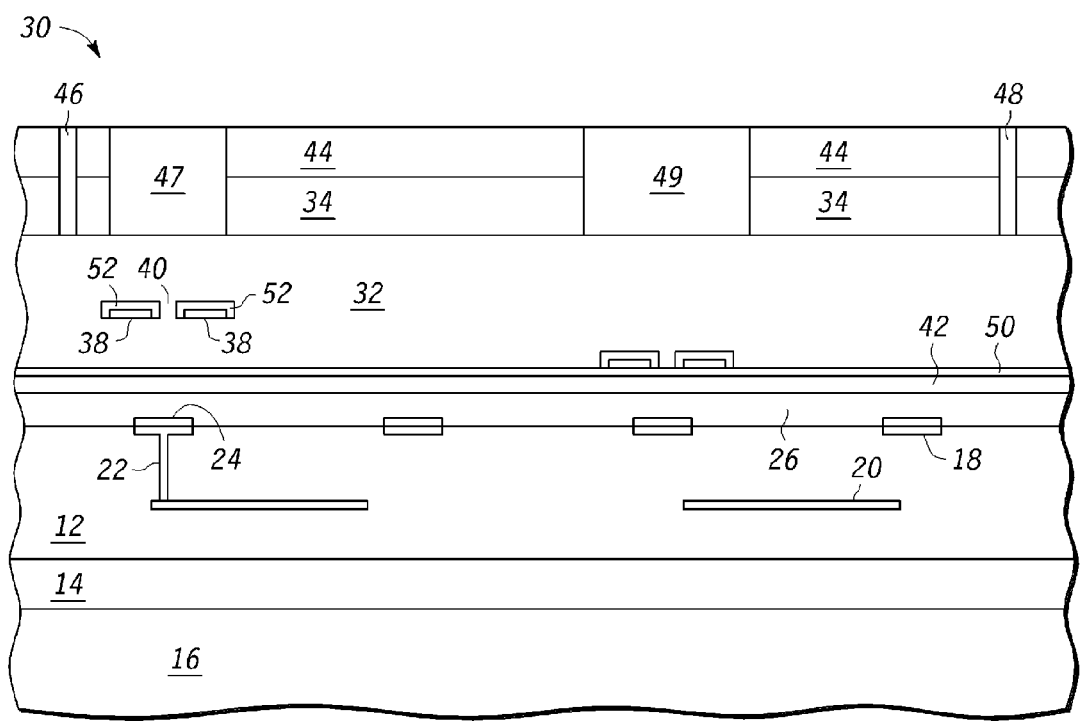
FIG. 4 is a partial side view of one embodiment of a semiconductor device during a processing stage, consistent with one embodiment of the invention.
Figure 5:
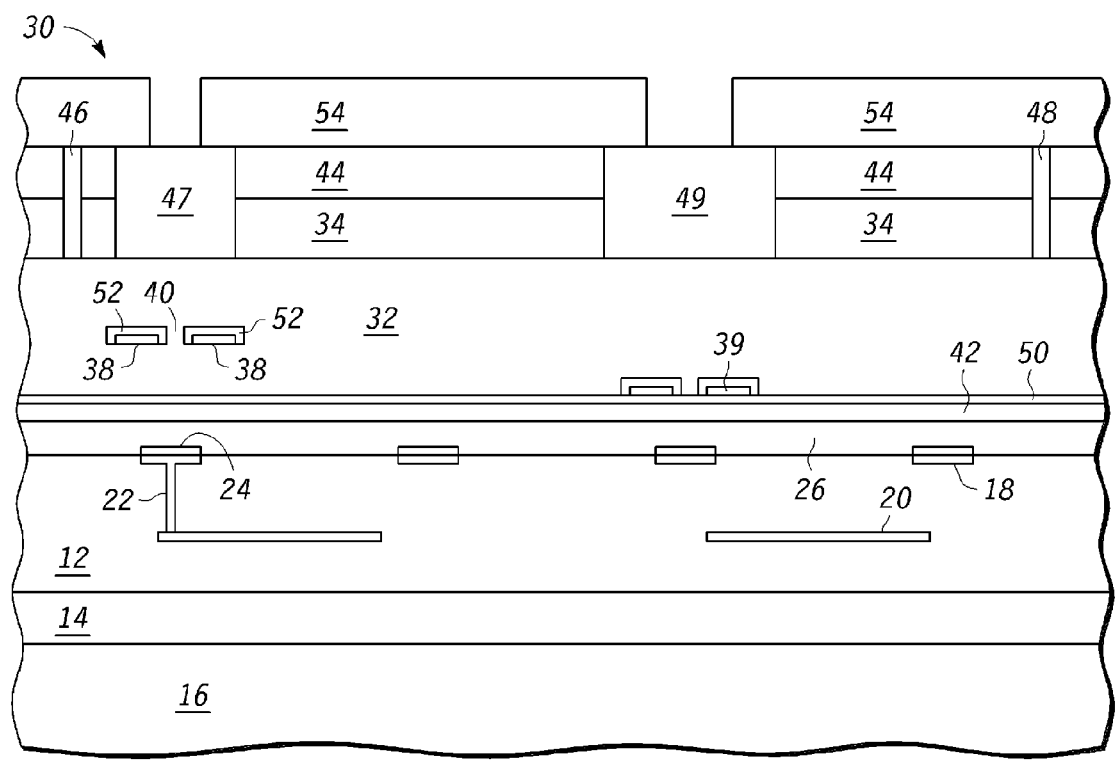
FIG. 5 is a partial side view of one embodiment of a semiconductor device during a processing stage, consistent with one embodiment of the invention.
Figure 6:
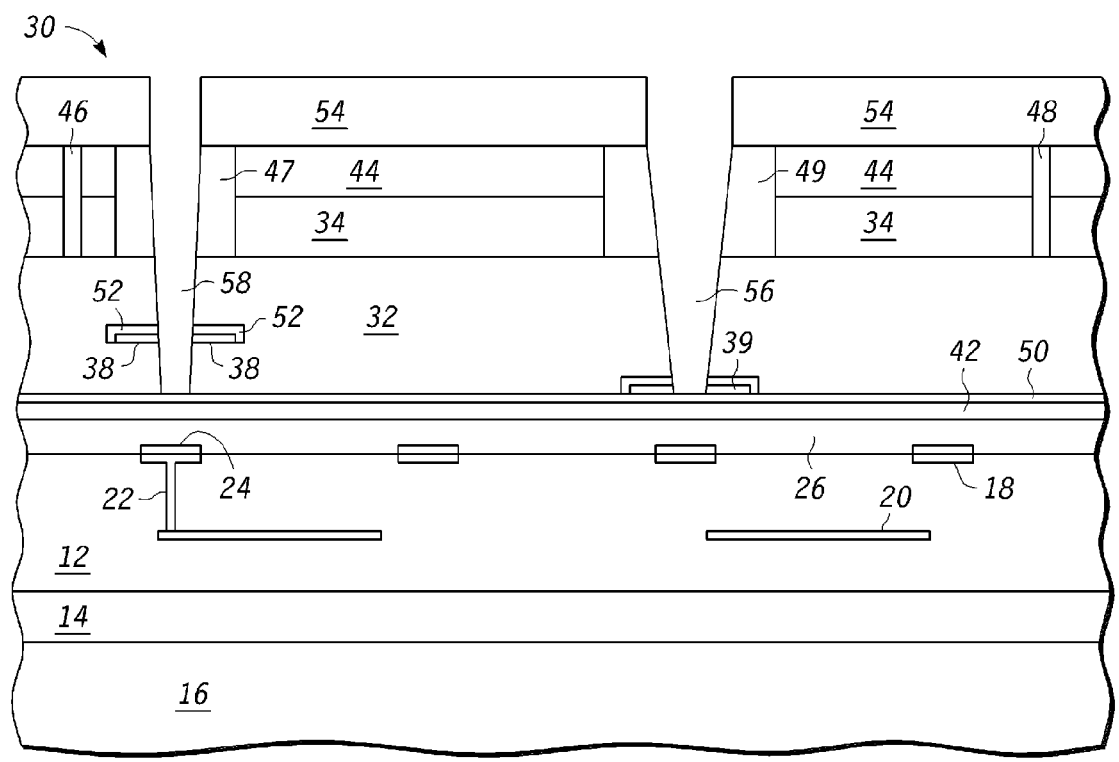
FIG. 6 is a partial side view of one embodiment of a semiconductor device during a processing stage, consistent with one embodiment of the invention.

Referring now to FIG. 4, semiconductor layer 36 of donor wafer 30 may be thinned using mechanical-chemical or chemical-mechanical processes to form thinned semiconductor layer 44. Next, as shown in FIG. 5, a patterned masking layer 54 may be formed over thinned semiconductor layer 44. Next, as shown in FIG. 6, by etching and using etch-stop layer 50, an opening 58 extending through opening 40 (shown in FIG. 5) in donor wafer 30 may be formed. Although etch-stop layer 50 is shown in FIG. 4 as being directly adjacent to bonding layer 42, etch-stop layer 50 may be placed at a different location in donor wafer 30. For example, etch-stop layer 50 may be placed directly under inter-wafer connect trace 38, if interconnect layer 32 did not have inter-wafer connect trace 39 or if inter-wafer connect trace 39 were at the same level as inter-wafer connect trace 38. Thus, by way of example, the etch-stop layer may always be positioned directly below the inter-wafer connect trace of an interconnect layer, such as interconnect layer 32, that is closest to the bonding surface of the wafer. Additional openings, as necessary, may be formed. For example, FIG. 6 shows an additional opening 56. Openings 56 and 58 may expose portions of inter-wafer connect trace 38 and 39. In particular, the etching process may etch away parts of barrier layer 52 to expose portions of inter-wafer connect trace 38 and 39.

Figure 7:
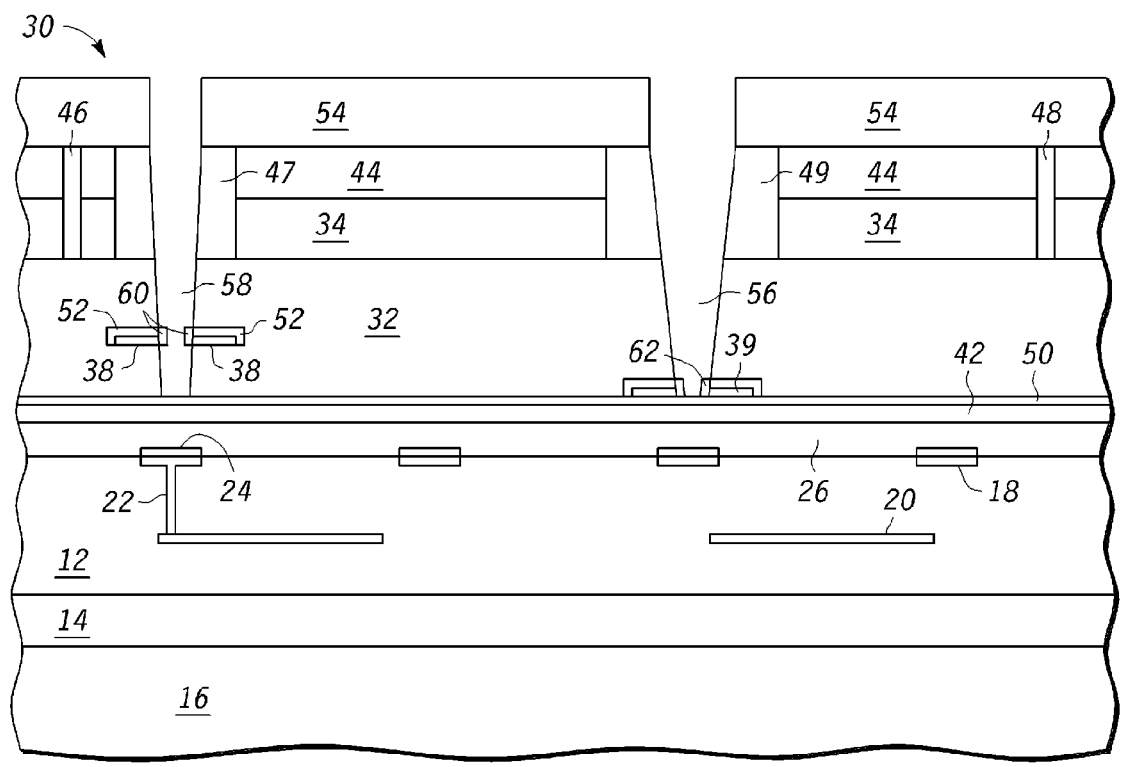
FIG. 7 is a partial side view of one embodiment of a semiconductor device during a processing stage, consistent with one embodiment of the invention.

Next, as shown in FIG. 7, a barrier (60, 62) may be selectively formed on exposed portions of inter-wafer connect trace 38 and 39. In one embodiment, barrier (60, 62) may be formed only on the exposed portions of inter-wafer connect trace 38 and 39. In one embodiment, prior to forming barrier (60, 62) exposed portions of inter-wafer connect trace 38 and 39 may be treated. Such treatment may include completely or partially removing barrier layer 52 or treating the exposed portions with catalytic materials, such as palladium or platinum. Exposed portions of inter-wafer connect trace 38 and 39 may result in the trace material, such as copper being exposed. Barrier (60, 62) may be formed directly on the exposed copper, for example. Barrier (60, 62) may be cobalt or nickel containing material, such as cobalt-tungsten-boron, cobalt-tungsten-phosphorous, cobalt-molybdenum-boron, cobalt-molybdenum-phosphorous, cobalt-rhenium-boron, cobalt-rhenium-phosphorous, nickel-tungsten-boron, nickel-tungsten-phosphorous, nickel-molybdenum-boron, nickel-molybdenum-phosphorous, nickel-rhenium-boron, nickel-rhenium-phosphorous, or it may be any other suitable etch resistant material. In another embodiment, exposed portions of inter-wafer connect trace 38 and 39 may still have a portion of barrier layer 52 with at least some of the copper exposed. Exposed portions of inter-wafer connect trace 38 and 39 may be used to grow the barrier layer. Exposed portions of inter-wafer connect trace 38 and 39 may first be treated using palladium and/or platinum, prior to growing the barrier layer.

Figure 8:
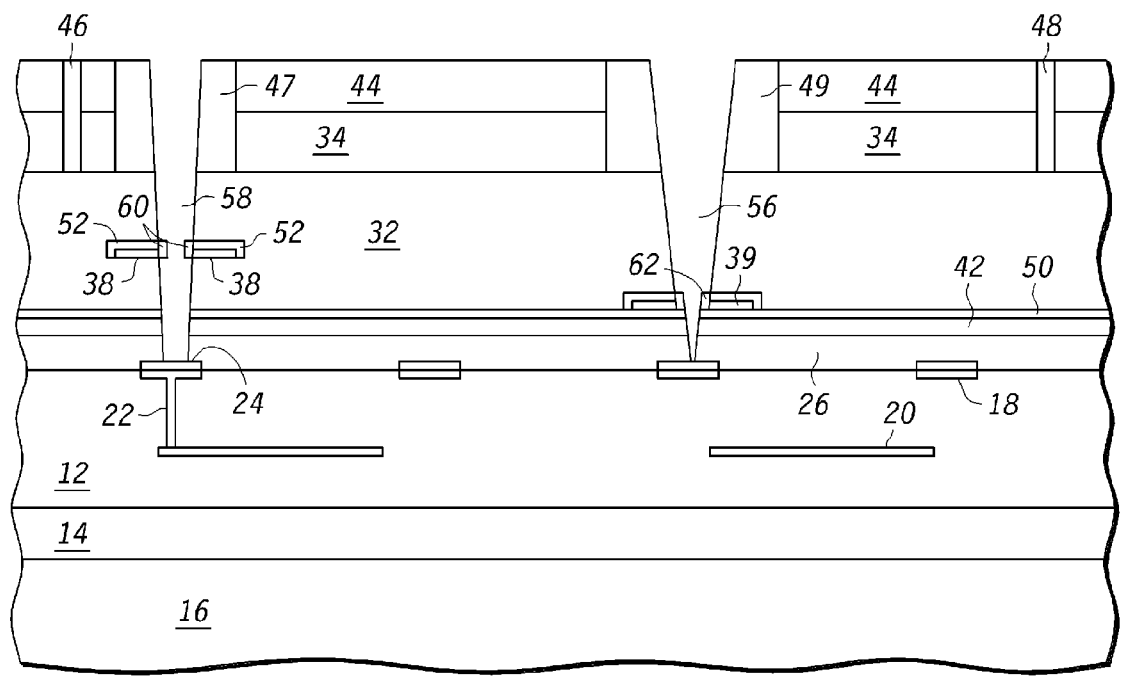
FIG. 8 is a partial side view of one embodiment of a semiconductor device during a processing stage, consistent with one embodiment of the invention.

Next, as shown in FIG. 8, using a second etch process, opening 58 may be extended to a landing pad (e.g., a landing pad similar to landing pad 18). Similarly, as part of the second etch process, opening 56 may be extended to another landing pad. Although FIG. 8 shows openings 56 and 58 extending to landing pads, these openings may extend to any metal line of acceptor wafer 10 to make appropriate interconnections.

Figure 9:
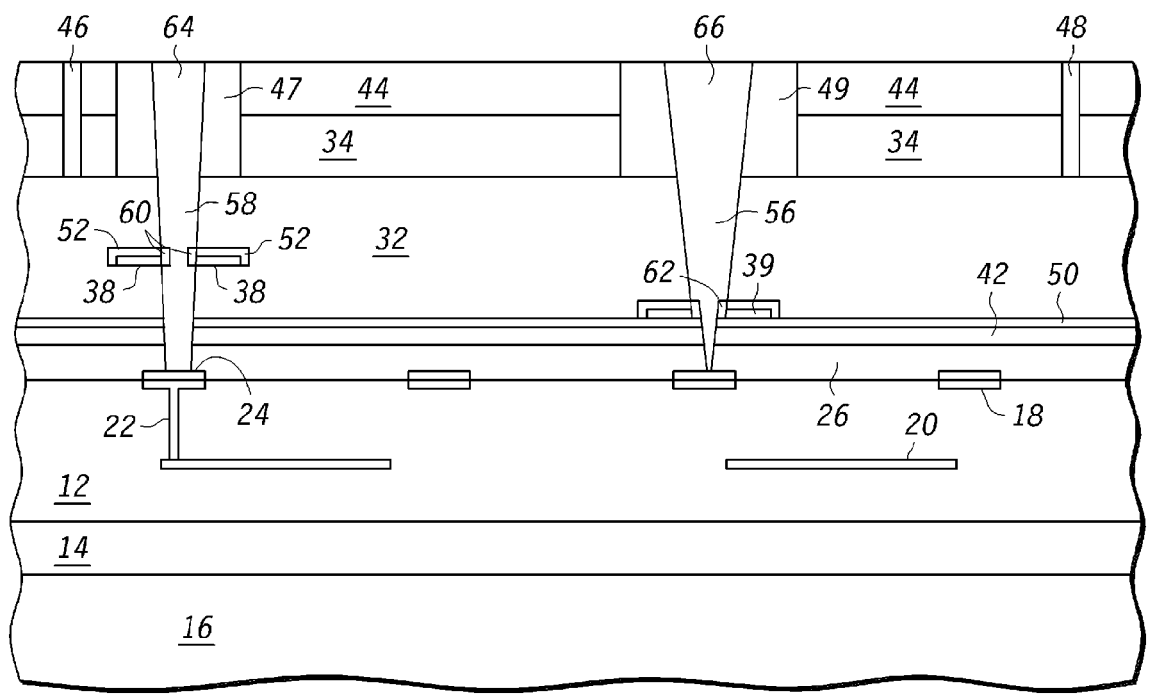
FIG. 9 is a partial side view of one embodiment of a semiconductor device during a processing stage, consistent with one embodiment of the invention.

Referring now to FIG. 9, conductive fill material 64 and 66 may be filled into openings 58 and 56, respectively, for electrically interconnecting acceptor wafer 10 and donor wafer 30. Conductive fill material 64 and 66 may be filled using processes, such as electroplating. Isolation windows 47 and 49 may keep active layer 34 and thinned semiconductor layer 44 electrically isolated from conductive fill material. Although not shown, a liner and seed layers may be formed in openings 56 and 58 prior to filling conductive fill material 64 and 66 into these openings. These layers may be formed using a chemical vapor deposition or a physical vapor deposition process. When a physical vapor deposition process along with a re-sputter process is used, the slight ledge formed by selective barrier 60 results in a better bottom sidewall coverage of liner and seed layers. Additionally, although not shown, additional steps may be performed subsequently to create singulated integrated circuits, for example.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device, comprising:
    providing a first integrated circuit having a landing feature;
    attaching a second integrated circuit to the first integrated circuit, the second integrated circuit having an inter-circuit trace, the inter-circuit trace having an inter-circuit trace opening;
    forming an opening through the second integrated circuit, the opening extending through the inter-circuit trace opening to the landing pad;
    forming a selective barrier on exposed portions of the inter-circuit trace in the opening; and
    filling the opening with a conductive fill material, wherein the conductive fill material electrically connects the inter-circuit trace and the landing feature.

2. The method of claim 1, wherein selective barrier comprises a material selected from a group consisting of cobalt and nickel.

3. The method of claim 1, wherein the selective barrier comprises cobalt.

4. The method of clam 3, wherein the selective barrier comprises tungsten.

5. The method of claim 1, wherein the selective barrier is formed only on the exposed portions of the inter-circuit trace in the opening.

6. The method of claim 1, wherein the landing pad comprises a conductive barrier layer comprising a material selected from a group consisting of cobalt and nickel.

7. The method of claim 1, wherein attaching the second integrated circuit to the first integrated circuit comprises attaching the second integrated circuit to the first integrated circuit using at least one bonding layer between the first and second integrated circuit.

8. The method of claim 7, wherein forming the opening comprises:
    forming the opening extending through the second integrated circuit and the inter-circuit trace opening to the at least one bonding layer; and
    extending the opening through the at least one bonding layer to the landing feature, wherein the landing feature comprises at least one of a landing pad and a metal trace.

9. The method of claim 1, wherein the inter-circuit trace comprises an inter-circuit trace barrier layer, and wherein prior to forming the selective barrier, the method further comprises treating exposed portions of the inter-circuit trace barrier layer.

10. The method of claim 1 further comprising forming a liner layer in the opening, prior to filling the opening with the conductive fill material.

11. The method of claim 1, wherein the inter-circuit trace comprises copper.

12. A method for forming a semiconductor device, comprising:
    providing a first integrated circuit having a landing feature;
    attaching a second integrated circuit to the first integrated circuit using at least one bonding layer, the second integrated circuit having an inter-circuit trace, the inter-circuit trace having an inter-circuit trace opening;
    forming an opening through the second integrated circuit, the opening extending through the inter-circuit trace opening;
    forming a selective barrier on exposed portions of the inter-circuit trace in the opening, the selective barrier comprising at least one material selected from a group consisting of cobalt and nickel;
    extending the opening through the at least one bonding layer to the landing feature; and
    after extending the opening, filling the opening with a conductive fill material, wherein the conductive fill material electrically connects the inter-circuit trace and the landing feature.

13. The method of claim 12, wherein attaching the second integrated circuit to the first integrated circuit using the at least one bonding layer comprises:
    attaching a first bonding layer formed on the first integrated circuit and a second bonding layer formed on the second integrated circuit.

14. The method of claim 12, wherein the inter-circuit trace comprises an inter-circuit trace barrier layer and wherein the exposed portions of the inter-circuit trace comprise at least a portion of the inter-circuit trace barrier layer, and wherein prior to forming the selective barrier, the method further comprises treating the at least a portion of the inter-circuit trace barrier layer.

15. The method of claim 12, wherein the at least one bonding layer comprises an etch stop layer, and wherein forming the opening through the second integrated circuit is performed such that the opening extends to the etch stop layer.

16. The method of claim 12 further comprising forming a liner layer in the opening, after extending the opening and prior to filling the opening.

17. The method of claim 12, wherein the landing feature comprises a conductive barrier layer comprising a material selected from a group consisting of cobalt and nickel, and wherein extending the opening through the at least one bonding layer to the landing feature is performed such that the opening exposes the conductive barrier layer of the landing feature.

* * * * *